United States Patent [19]
Nakanishi

[11] Patent Number: 5,675,236
[45] Date of Patent: Oct. 7, 1997

[54] LOW BATTERY POWER STATE DETERMINATION APPARATUS AND METHOD FOR SECONDARY BATTERY

[75] Inventor: Hideki Nakanishi, Tokyo, Japan

[73] Assignee: Canon Kabushiki Kaisha, Tokyo, Japan

[21] Appl. No.: 448,793

[22] Filed: May 24, 1995

[30] Foreign Application Priority Data

May 25, 1994 [JP] Japan ................... 6-111271

[51] Int. Cl.$^6$ .............................. H01M 10/44; H02J 7/00
[52] U.S. Cl. .................... 320/48; 320/21; 320/32
[58] Field of Search ..................... 320/13, 21, 30, 320/32, 33, 48; 324/433

[56] References Cited

U.S. PATENT DOCUMENTS

| | | | |
|---|---|---|---|
| 4,906,055 | 3/1990 | Horiuchi | 320/48 X |
| 4,929,931 | 5/1990 | McCuen | 320/48 X |
| 5,032,825 | 7/1991 | Kuznicki | 320/48 X |
| 5,166,623 | 11/1992 | Ganio | 320/32 X |
| 5,287,286 | 2/1994 | Ninomiya | 320/48 X |
| 5,343,137 | 8/1994 | Kitaoka et al. | 320/13 |
| 5,355,072 | 10/1994 | Satsuma et al. | 320/13 |

Primary Examiner—Peter S. Wong
Assistant Examiner—Patrick B. Law
Attorney, Agent, or Firm—Fitzpatrick, Cella, Harper & Scinto

[57] ABSTRACT

Current of electricity provided from a secondary battery 1 to a load 2, such as a personal computer and a printer, is determined by a current determination circuit 8. The detected result is compared with a predetermined threshold by a comparing circuit 7, the comparison result is used to deciding a voltage threshold for judging whether or not the secondary battery is in a low battery power state. After the voltage threshold is decided, a terminal voltage of the secondary battery is measured by a voltage determination circuit 6, then the measured result is compared with the voltage threshold. Thereby whether or not the secondary battery 1 is in a low battery power state is judged.

8 Claims, 11 Drawing Sheets

I

LOW BATTERY POWER STATE DETERMINATION APPARATUS AND METHOD FOR SECONDARY BATTERY

BACKGROUND OF THE INVENTION

The present invention relates to a low battery power state determination apparatus and method for using a secondary battery during operation of the secondary battery.

A secondary battery is a type of battery which can be repeatedly used by charging and discharging it alternately. Normally, the secondary battery currently discharging starts being charged when battery power becomes low.

Conventionally, determination of a low battery power state (low battery power state determination) is performed as follow.

FIG. 4 is a graph showing a curve of voltage of a general secondary battery (change of secondary battery voltage during discharging with lapse of time). The low battery power state determination is performed by observing the curve of voltage. A processing sequence of low battery power state determination is described below.

(1) Determine terminal voltage (battery voltage) of the secondary battery, $V_{batt}$.

(2) Compare $V_{batt}$ to a predetermined voltage, $V_{end}$.

(3) Perform following determination process in accordance with the comparison result, if $V_{batt} > V_{end}$, then the secondary battery continues discharging if $V_{batt} \leq V_{end}$, then the secondary battery stops discharging (low battery power state)

Note that, when the secondary battery continues discharging, an electronic device having the secondary battery, such as a personal computer and the like, is under operation.

Generally, the terminal voltage of the secondary voltage, $V_{batt}$ used for detecting the low battery power state is expressed by following equation.

$$V_{batt} = E - r \cdot I \qquad (*)$$

where E is electromotive force, r is an internal resistance of the secondary battery, and I is discharged current. As seen in the equation (*), the terminal voltage of the secondary battery $V_{batt}$ depends upon the internal resistance r and the discharged current I.

Further, the internal resistance r depends upon change of the discharged current I and temperature of atmosphere T in a non-linear manner, and has following characteristics.

The internal resistance r is large when the discharged current is large.

The internal resistance r is large when the temperature of atmosphere is low.

There are defects, described below, in the conventional method of the low battery power state detection when the determination is performed by using the equation (*) only.

(I) Apparent drop of discharging power

When the secondary battery is used at high discharging rate (large current I) or used under low temperature circumstance (low temperature T), drop of voltage from the electromotive force E (second term, r·I in the equation (*)) is large because of the aforesaid characteristics of r. Accordingly, a value of the terminal voltage of the secondary battery $V_{batt}$ which is actually determined is very small comparing to the electromotive force. Therefore, even though the electromotive force E is not very weak, the secondary battery tends to be determined that it is in the low battery power state ($V_{batt} \leq V_{end}$).

This has the same effect as terminating discharging before while there is power available in the secondary battery (apparent drop of discharging power).

(II) Drop of the internal resistance caused by rise of temperature of the secondary battery.

Under low temperature circumstance and in a very high discharge rate (large current discharge), the internal resistance r may change as described below.

(1) The internal resistance r is very large at the beginning of discharge.

(2) Temperature of the secondary battery rises by heat of the internal resistance when the discharge of the secondary battery is continued for a certain period of time. So the internal resistance r is reduced.

(3) After a while, the temperature of the secondary battery and the temperature of atmosphere are balanced, and the resistance r is stabilized.

The change of the terminal voltage of the secondary battery $V_{batt}$ at these stages as described above with respect to lapse of time is shown in FIG. 5.

In the stage (1), since the internal resistance r is very large, $V_{batt}$ drops sharply. In the stage (2), change of the internal resistance r is larger than the decrease in the electromotive force E, and $V_{batt}$ starts increasing gradually. In the stage (3), the internal resistance r is stabilized, thus $V_{batt}$ starts decreasing again (the rate of drop in this stage is smaller than that in the stage (1)).

In a case where the terminal voltage of the secondary battery $V_{batt}$ drops in two different stages as shown in FIG. 5, sometimes the secondary battery reaches the low battery power state ($V_{batt} \leq V_{end}$). However, the battery is not actually in the low battery power state yet. Thus, if discharging is terminated here, the battery starts being charged in a state where energy of the battery is not quite consumed.

If the secondary battery which is charged before discharging the battery enough is kept using as in the two above described examples, following problems arise.

Efficiency of the secondary battery per cycle (work/cycle) decreases.

When a Ni-Cd secondary battery or a Ni-MH2 secondary battery is used, "memory phenomenon" is caused.

"Memory phenomenon" is a phenomenon in which, when the battery starts being charged before being discharged sufficiently, the battery "memorizes" the voltage where the battery starts being charged, and when it discharges, the voltage of the battery starts dropping sharply at the "memorized" voltage that is higher than a former voltage where the voltage started dropping sharply.

SUMMARY OF THE INVENTION

The present invention has been made in consideration of the above situation, and has its object to provide a low battery power state determination apparatus and method for a secondary battery to be capable of determining the low battery power state of the secondary battery precisely, thus improving efficiency of the battery per cycle and preventing memory phenomenon.

According to the present invention, the foregoing object is attained by providing a low battery power state determination apparatus for a secondary battery comprising: voltage determination means for determining a terminal voltage of the secondary battery; current determination means for determining a discharged current during discharge of the secondary battery; control means for deciding a threshold voltage for judging whether or not the secondary battery is in the low battery power state on the basis of the value of the current determined by the current determination means; and judging means for judging whether or not the secondary battery is in the low battery power state by comparing the threshold voltage with the terminal voltage determined by the voltage determination means.

Further, the foregoing object is also attained by providing a low battery power state determination apparatus for a secondary battery comprising: voltage determination means for determining a terminal voltage of the secondary battery at a predetermined time period; calculation means for calculating change of voltage on the basis of the terminal voltage determined in the previous routine of a low battery state determination process and a currently determined terminal voltage; comparing means for comparing the calculated change of voltage and a predetermined value; and judging means for judging whether or not the secondary battery is in the low battery state on the basis of the comparison result by the comparing means.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT(S)

Preferred embodiments of the present invention will be described in detail in accordance with the accompanying drawings.

<Explanation of a Configuration of a Low Battery Power State Determination apparatus>

Figure 1:
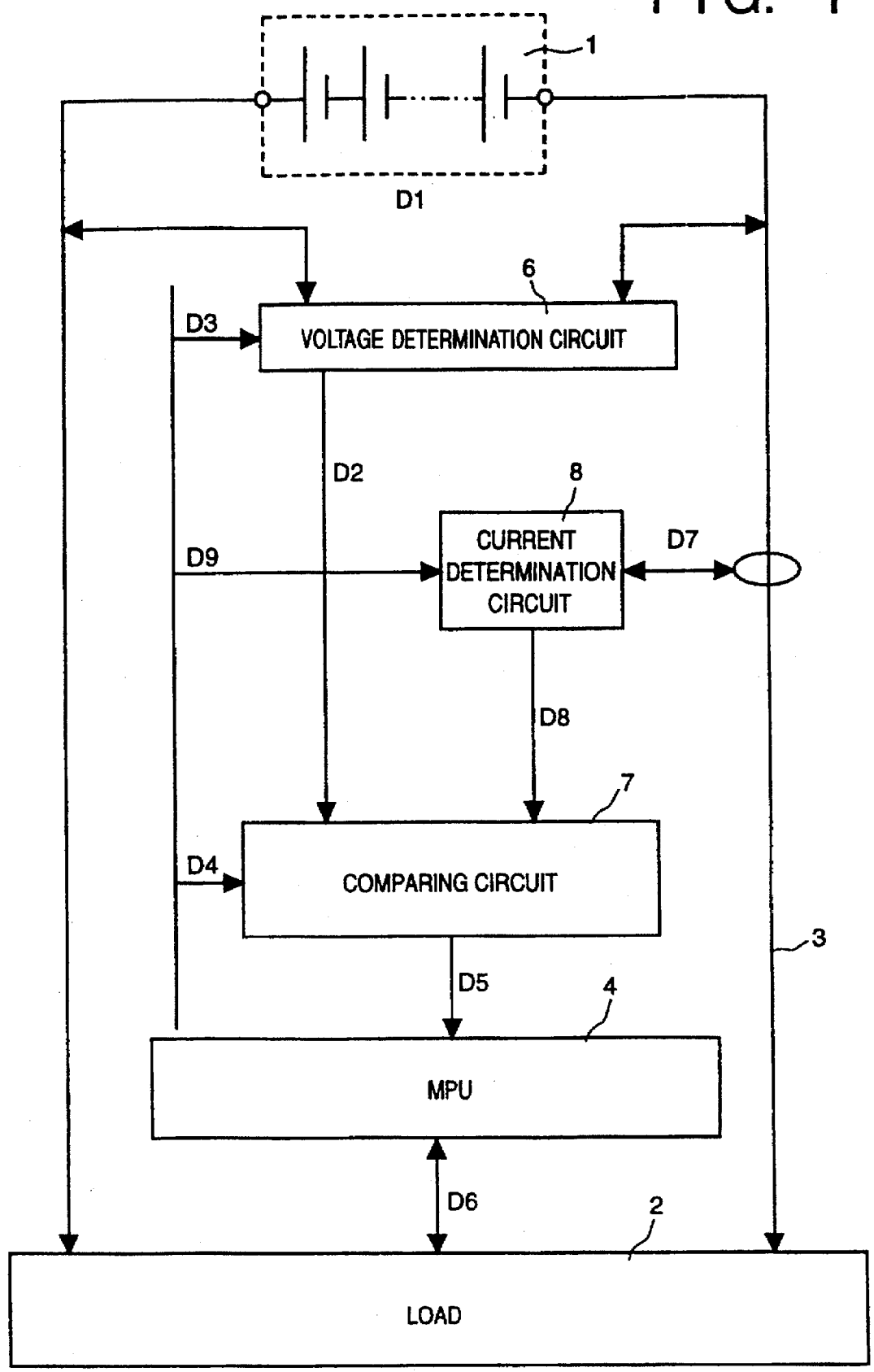
FIG. 1 illustrates a configuration of a low battery power state determination apparatus according to a first embodiment of the present invention.

FIG. 1 shows a configuration of a low battery power state determination apparatus of the present invention.

In FIG. 1, reference numeral 1 denotes a secondary battery; 2, a load (an electronic device, such as a personal computer and a printer) which is driven by the secondary battery 1; and 3, power line for supplying power from the secondary battery 1 to the load 2.

Regarding a unit for determining the low battery power state, reference numeral 4 denotes MPU for controlling the system; 5, bus line for transmitting an instruction from the MPU 4 to each element of the system; 6, a voltage determination circuit for measuring a terminal voltage of the secondary battery 1; 8, a current determination circuit for measuring current supplied from the secondary battery 1 to the load 2; and 7, a comparing circuit for comparing data determined by the aforesaid units with predetermined values. It should be noted that the MPU 4 and the load 2 are separate elements in FIG. 1, however, when a personal computer or a printer is used as the load 2, since those devices include MPUs for exclusive use, those MPUs can be used instead.

Each data in FIG. 1 will be described. Reference numeral D1 denotes a terminal voltage of the secondary battery 1, $V_{batt}$; D7, current $I_{batt}$ provided from the secondary battery 1 to the load 2; D2, data of $V_{batt}$ determined by the voltage determination circuit 6 and to be transmitted to the comparing circuit 7; DS, data of $I_{batt}$ determined by the current determination circuit and to be transmitted to the comparing circuit 7; D5, a comparison result of the comparing means and to be transmitted to the MPU 4.

Instructions to be issued by the MPU 4 are a control instruction D3 to control the voltage determination circuit 6, a control instruction D9 to control the current determination circuit 8, a control instruction D4 to control the comparing circuit 7, and a control instruction D6 to control operations of the load 2.

Note that, in the MPU 4, ROM storing an operational sequence of itself (a program corresponding to respective flowchart to be described later) and RAM used as a work area are provided.

<Explanation of Operations>

Figure 6:
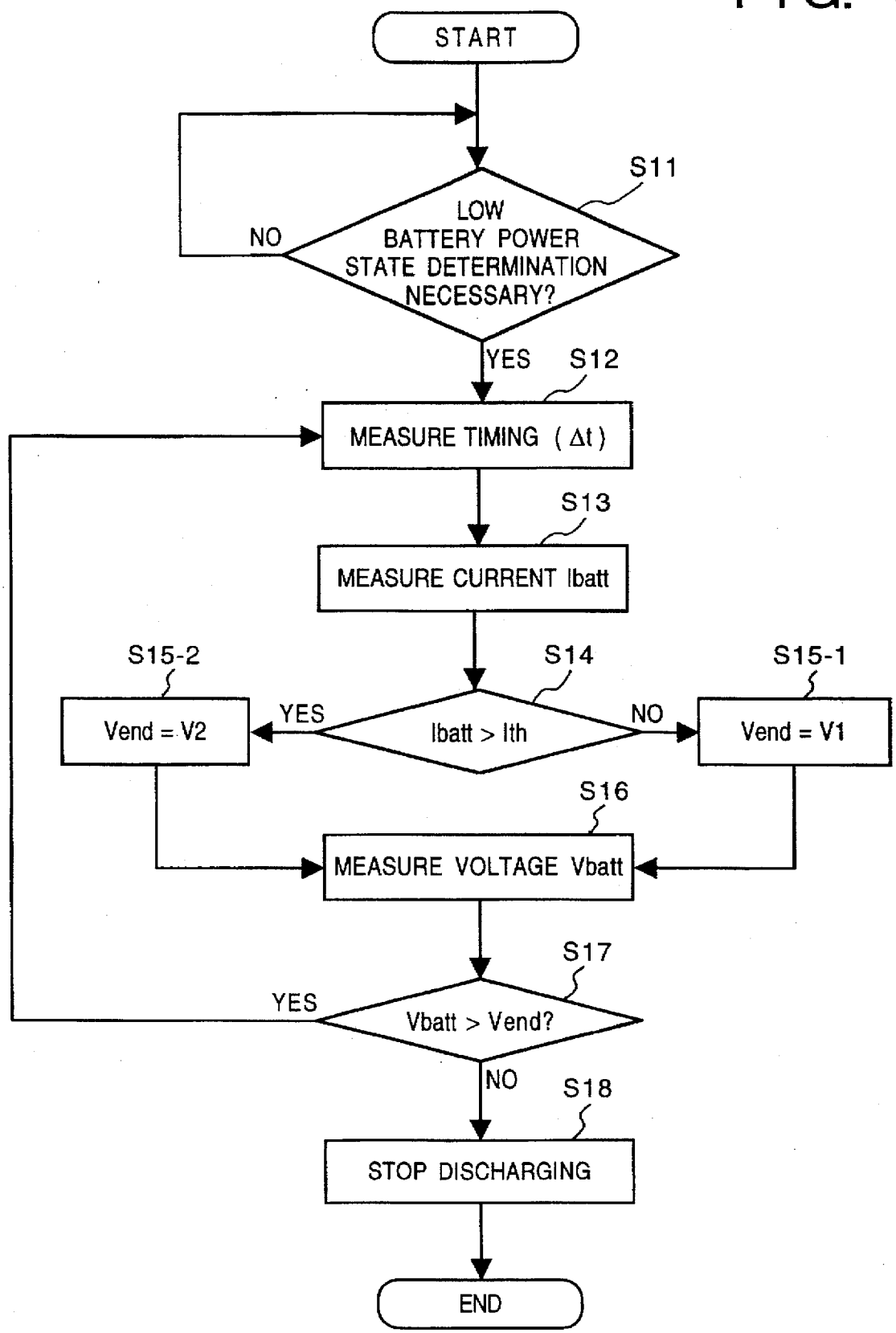
FIG. 6 is a flowchart showing a processing sequence according to the first embodiment.

An operation of the apparatus having above configuration according to the first embodiment will be described with reference to a flowchart in FIG. 6.

First, the MPU 4 determines whether or not the low battery power state determination is necessary upon driving a device (load 2) at step S11. If the apparatus is supplied with electricity from an AC adapter (AC/DC converter) or the like, following sequence is not performed. Namely, "No" at step S11.

When the battery power state determination is necessary since power is supplied to the apparatus from the secondary battery 1 ("Yes" at step S11), first, the MPU 4 determines a timing to determine the low battery power state at step S12. The low battery power state determination is performed at every fixed time interval ($\Delta t$).

At the timing for the low battery power state determination, the current determination circuit 8 measures the current $I_{batt}$ (D7) provided to the load 2 at step S13.

Next, the determined result (the signal D8 ($=I_{batt}$) from the current determination circuit 8) is transmitted to the comparing circuit 7, and the comparing circuit 7 compares $I_{batt}$ with a value $I_{th}$ (designated by the MPU 4 as the D4) at step S14. It should be noted that the threshold $I_{th}$ is determined in dependence upon the type of secondary battery, resistance of the load 2, and so on.

Then, the comparison result (D5) is sent to the MPU 4. On the basis of this result, the MPU 4 determines the threshold voltage $V_{end}$ at steps S15-1 and S15-2.

$I_{batt} \leq I_{th}$ (NO at S14)→$V_{end}=V_1$ (S15-1)

$I_{batt} > I_{th}$ (Yes at S14)→$V_{end}=V_2$ (S15-2)

where $V_2$ is smaller than $V_1$.

Then, the voltage determination circuit 6 measures the terminal voltage of the secondary battery 1 $V_{batt}$ (D1) at step S16, and the determined result (D2) is provided to the comparing circuit 7. Accordingly, the comparing circuit 7 compares $V_{batt}$ with either one of the threshold voltages $V_{end}$ (sent as D4 by the MPU 4) determined at step S15-1 or at step S15-2 (step S17).

The comparison result (D5) is transmitted to the MPU 4, and the MPU 4 performs following determination on the basis of the comparison result.

If $V_{batt} > V_{end}$ (Yes, at S17), then the MPU determines that the secondary battery 1 is not in a low battery power state, and the process moves back to step S12, and the low battery power state determination is continued.

If $V_{batt} \leq V_{end}$ (NO, at step S17), then the MPU determines that the secondary battery 1 is in a low battery power state, issues an instruction (D6) to terminate the operation of the load 2, and controls the secondary battery to stop discharging at step S18.

When discharge is terminated, if the load 2 which detected the operation terminating instruction D6 is a personal computer or a printer, a message indicating that the operation can not be continued because of the low remaining charge in the secondary battery may be displayed or a buzzer or the like may be used.

The brief flow of the operation is as described above, and processes at each processing step will be described more in detail.

Step S12

A load (load 2) of the apparatus is often an alternating load having a substantially fixed frequency. Thus, the low battery power state determination should be performed at a same timing of the fixed frequency every time. For example, if the load 2 is a printer, an operation of feeding a paper sheet and an operation of printing are alternately repeated. In this case, the low battery power state determination is performed during either one of the two operations, namely feeding a paper sheet or printing.

Note that a large current flows through a "heavy" load, whereas, a "small" current flows through a "light" load.

Steps S13 to S17

The low battery power state determination is actually performed at steps S13 to S17. If a load is somewhat large ($I_{batt} > I_{th}$), the threshold voltage $V_{end}$ is set to a little lower voltage than usual ($V_{end}=V1 \rightarrow V2$, $V1 > V2$) in consideration of increase in dropping rate of a voltage (rI) of the secondary battery. Naturally, as $V_{end}$ decreases, total power to be drawn from the secondary battery 1 increases.

Accordingly, if the secondary battery is discharged at high rate, the low battery power state is determined. Therefore, when the discharge is stopped, the remaining power of the secondary battery is small.

According to the first embodiment as described above, without comparing a voltage of the secondary battery with a threshold voltage, more precise low battery power state determination can be performed by adjusting threshold for detecting the low battery power state depending upon the current provided from the secondary battery 1 to the load 2.

[Second Embodiment]

A second embodiment is next described.

<Explanation of a Configuration of a Low Battery Power State Determination apparatus>

Figure 2:
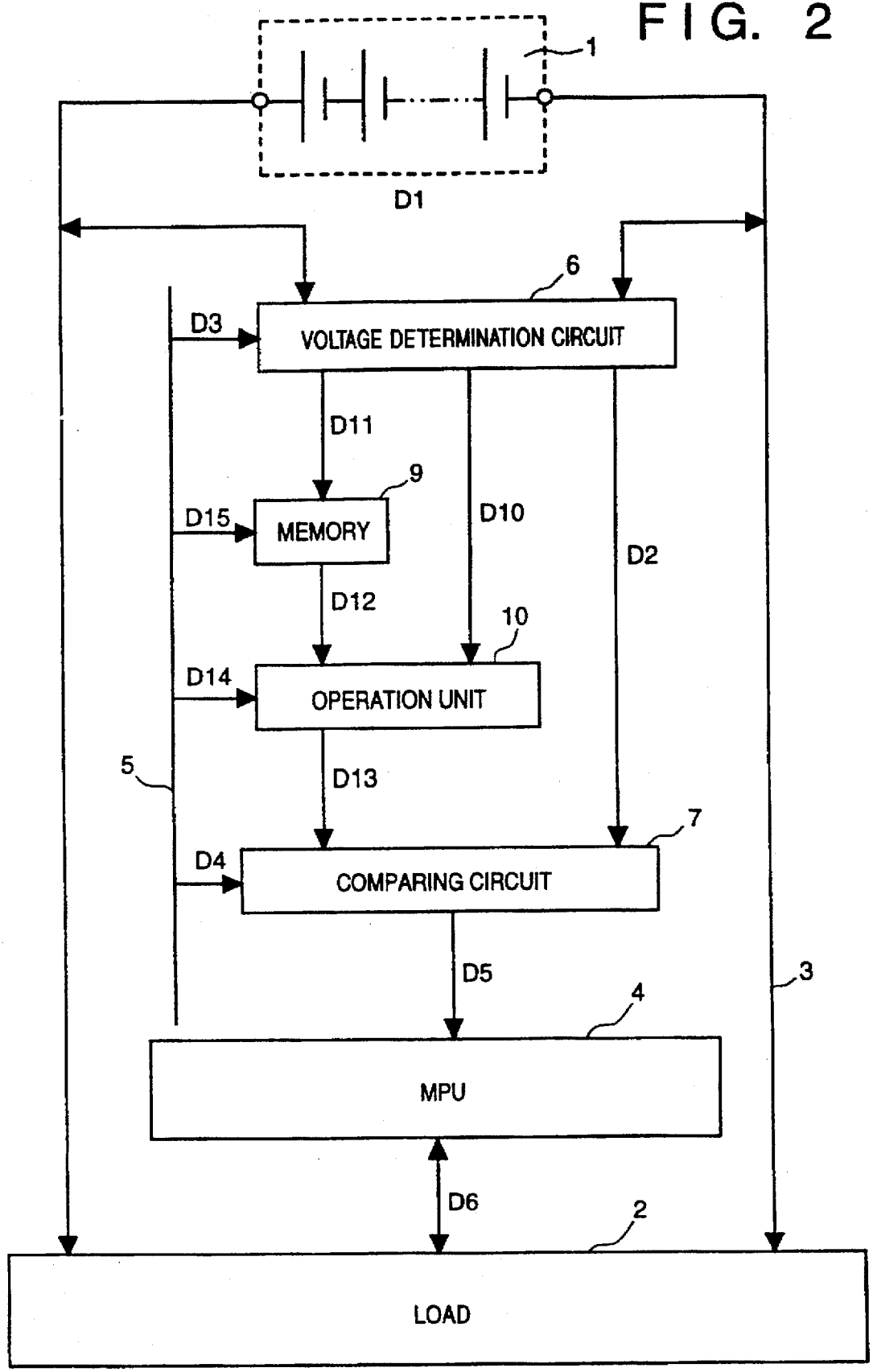
FIG. 2 illustrates a configuration of a low battery power state determination apparatus according to a second embodiment of the present invention.

FIG. 2 shows a configuration of a low battery power state determination apparatus of the present invention. In order that the second embodiment and the first embodiment can be compared easily, the same or similar constitutional elements or devices in these embodiments have the same reference numerals.

In FIG. 2, reference numeral 1 denotes a secondary battery; 2, a load (an electronic device, such as a personal computer and a printer) which is driven by the secondary battery 1; and 3, a power line for supplying power from the secondary battery 1 to the load 2.

Regarding a unit for determining the low battery power state, reference numeral 4 denotes MPU for controlling the whole system; 5, a bus line for transmitting an instruction from the MPU 4 to each element of the apparatus; 6, a voltage determination circuit for measuring a terminal voltage of the secondary battery 1; 7, a comparing circuit for comparing arbitrary two different values; 9, a memory for temporary storing the value measured by the voltage determination circuit 6; and 10 an operation circuit for finding the difference between two arbitrary two different values.

Data in FIG. 2 will be described. Reference numeral D1 denotes a terminal voltage of the secondary battery 1, $V_{batt}$. Reference numerals D2, D10, D11 denote data ($V_{batt}$) measured by the voltage determination circuit 6, and are sent to the comparing circuit 7, the operation circuit 10, and the memory 9, respectively. Reference numeral D12 denotes output data from the memory 9 and sent to the operation circuit 10; D13, a calculated result by the operation circuit 10 and is outputted to the comparing circuit 7. Further, reference numeral D5 denotes an analyzed data by the comparing circuit 7, and is sent to the MPU 4.

Instructions issued by the MPU 4 are a control instruction D3 to control the voltage determination circuit 6, a control instruction D14 to control the operation circuit 10, a control instruction D15 to control the memory 9, a control instruction D4 to control the comparing circuit 7, and a control instruction D6 to control operations of the load 2.

<Explanation of Operations>

Figure 7:
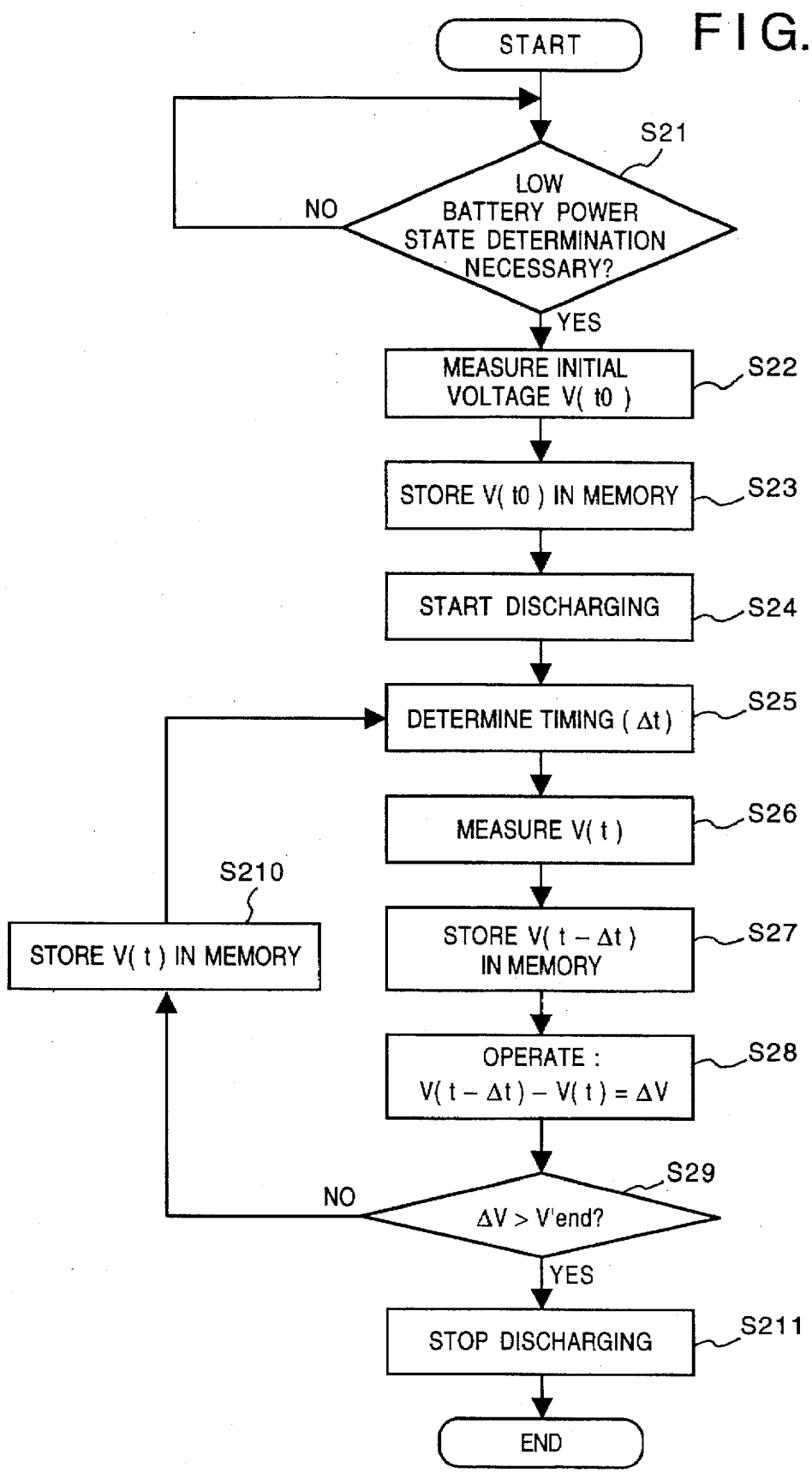
FIG. 7 is a flowchart showing a processing sequence according to the second embodiment.

Operation of the apparatus having above configuration according to the second embodiment will be described with reference to a flowchart in FIG. 7. A program responsible for the operation in the flowchart in FIG. 7 is stored in a ROM (not shown) in the MPU 4.

First, the MPU 4 determines whether or not the low battery power state determination is necessary upon driving a device (load 2) at step S21. If the apparatus is supplied with electricity from an AC adapter or the like, following sequence is not performed ("No" at step S21).

When the low battery power state determination is necessary since power is supplied to the apparatus from the secondary battery 1, namely, "Yes" at step S21, the MPU 4 controls the voltage determination circuit 6 to measure a voltage at step S22 across the secondary battery 1 just before starting discharge. The measured value $V(t_0)$ is temporary stored in the memory 9 at step S23.

Then, the device (load 2) starts operating, driven by the secondary battery 1 at step S24. The MPU 4 determines the timing to determine the low battery power state. The low battery power state determination is performed at every fixed time interval ($\Delta t$) (step S25).

At the timing for the low battery power state determination, the voltage determination circuit 6 measures the terminal voltage of the secondary battery 1 $V_{batt}(t)$ at step S26.

After this, the MPU 4 controls the memory 9 to transmit the terminal voltage of the secondary battery 1 V(t−Δt), determined in the former routine, to the operation circuit 10 at step S26.

The operation circuit 10 calculates difference between the value V(t−Δt) transmitted from the memory 9 and the latest voltage V(t) measured by the voltage determination circuit 6, ΔV=V(t−Δt)−V(t), at step S28.

The calculated result ΔV is transmitted to the comparing circuit 7, which compares a predetermined value V'$_{end}$ to ΔV at step S29.

The comparison result (D5) is transmitted to the MPU 4. The MPU 4 performs following determination on the basis of the comparison result.

If ΔV≦V'$_{end}$ (NO, at step S29), then the MPU determines that the secondary battery 1 is not in the low battery power state. Then the MPU 4 controls the memory to store V(t) at step S210, and the process moves back to step S25, and the low battery power state determination is continued.

If ΔV>V'$_{end}$ (Yes, at S29), then the MPU determines that the secondary battery 1 is in the low battery power state. Accordingly, the MPU 4 issues an instruction D6 to terminate the operation of the load 2, and controls the secondary battery to stop discharging at step S211.

The detail of the aforesaid process according to the second embodiment will be described below.

The value ΔV used for determining the low battery power state in the second embodiment is described as follow on the basis of the equation (*), $$\begin{aligned}\Delta V &= V(t-\Delta t) - V(t) \\ &= \{E(t-\Delta t) - rI(t-\Delta t)\} - \{E(t) - rI(t)\} \\ &= \{E(t-\Delta t) - E(t)\} - r\{I(t-\Delta t) - I(t)\}\end{aligned}$$

Here, if the low battery power state determination is performed so that Δt satisfies a condition, $$I(t-\Delta t)-I(t)=0 \rightarrow \Delta V=E(t-\Delta t)-E(t),$$

at step S25, then ΔV becomes a parameter which has no relationship with the discharge current I and the internal resistance r.

Figure 4:
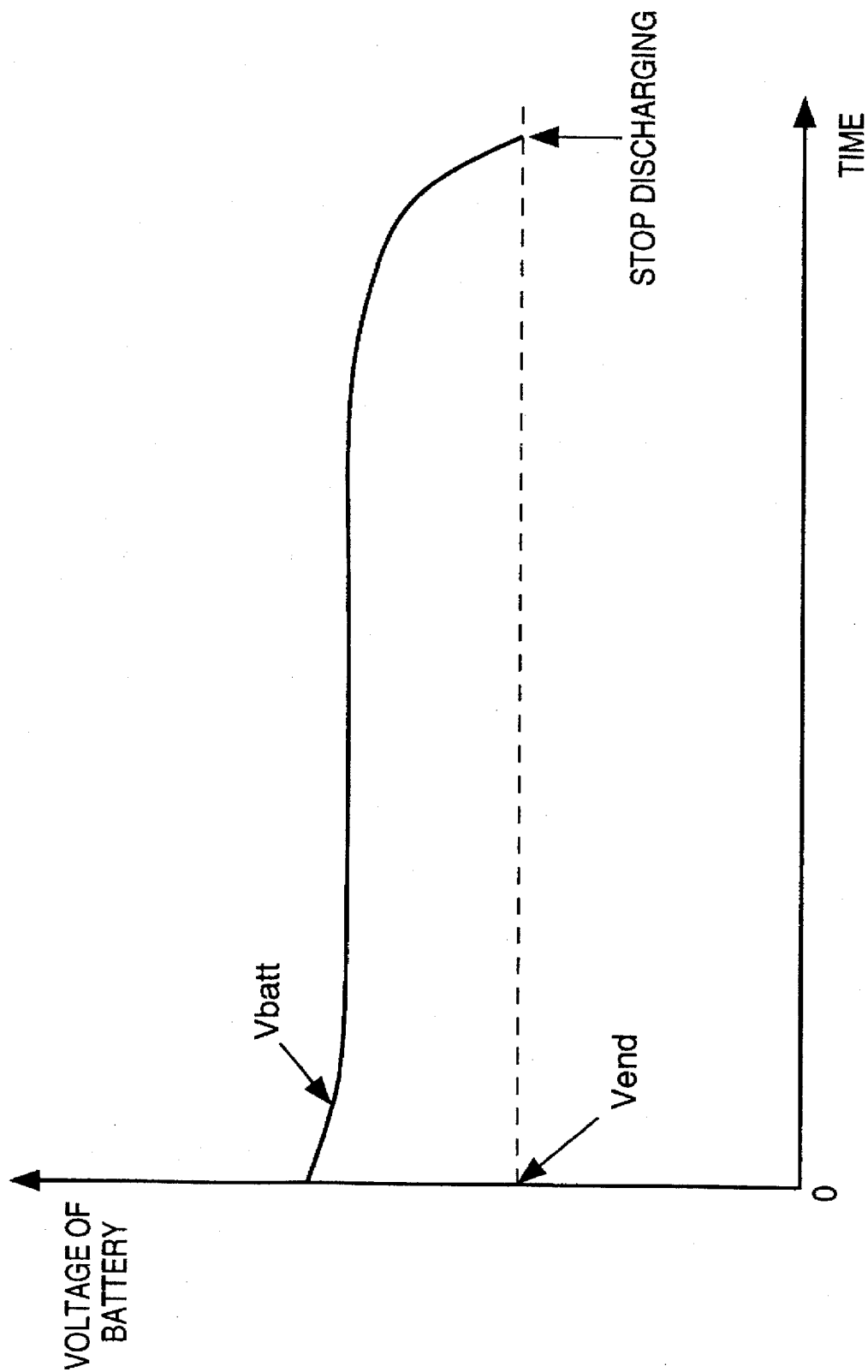
FIG. 4 is a graph showing change of a terminal voltage of a general secondary battery by discharge.

Further, as a characteristic of the secondary battery, "when the state of secondary battery becomes close to the low battery power state, the electromotive force of the battery decreases suddenly, thus the curve of voltage vs. time (refer to FIG. 4) drops sharply. Namely, Normal state . . . ΔV is very small Near low battery power state . . . ΔV is large.

Therefore, by observing ΔV, regardless of changes in the discharging current I and the internal resistance r of the secondary battery 1, the low battery power state can be determined. More specifically, at high discharge rate, such as when a discharging unit is powered on (when I is large), the secondary battery 1 is not determined that it is in the low battery power state, thus power of the secondary battery can be drawn very efficiently.

According to the second embodiment as described above, it is possible to detect the low battery power state of the secondary battery precisely when the voltage of the secondary battery has decreased near to the low battery power state.

[Third Embodiment]

A third embodiment will be next described.

<Explanation of a Configuration of a Low Battery Power State Determination apparatus>

Figure 3:
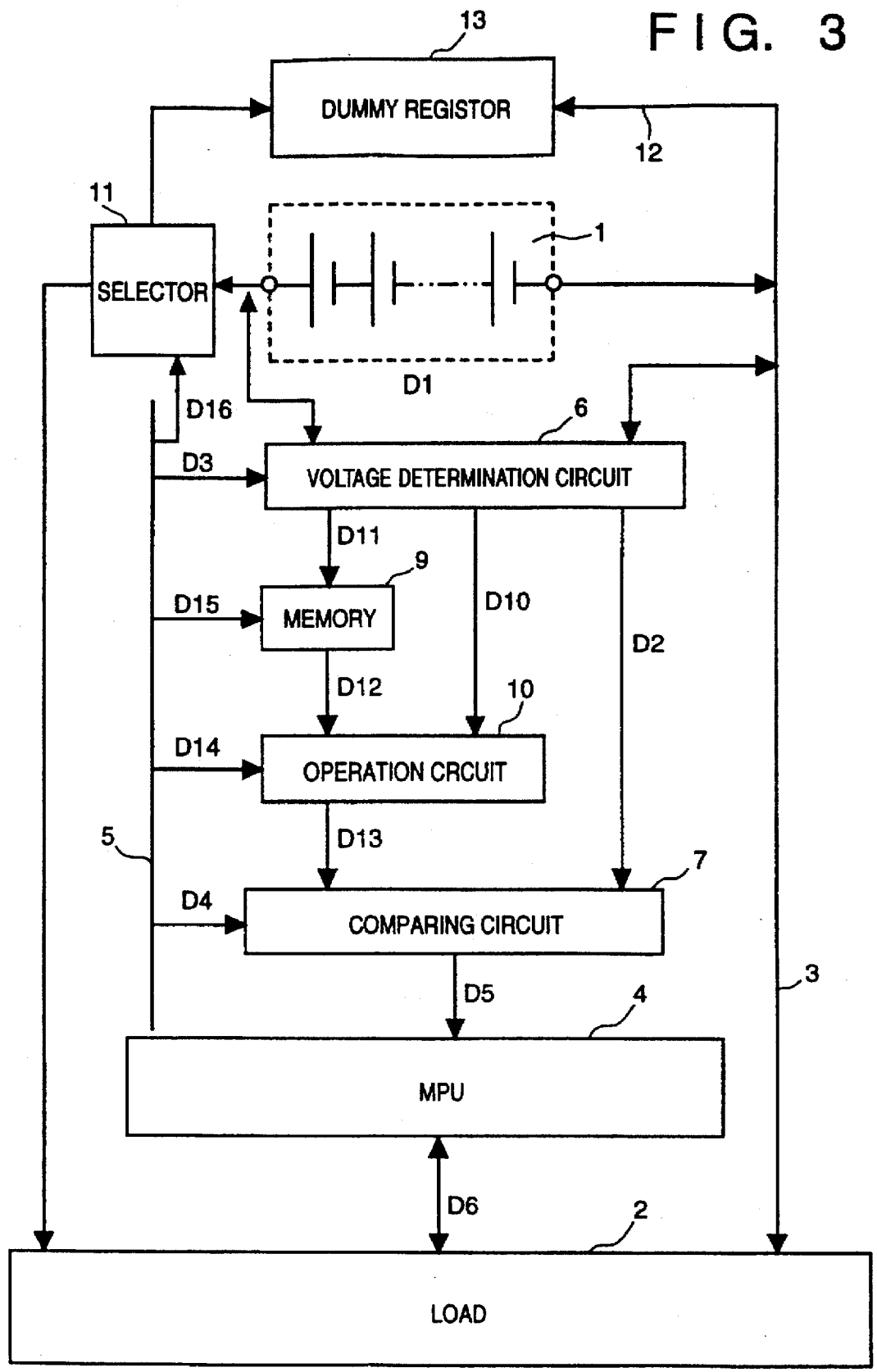
FIG. 3 illustrates a configuration of a low battery power state determination apparatus according to a third embodiment of the present invention.

FIG. 3 shows a configuration of a low battery power state determination apparatus according to a third embodiment.

The same or similar constitutional elements or devices in the third embodiments have the same reference numerals as those in the first and second embodiment.

In FIG. 3, reference numeral 1 denotes a secondary battery; 2, a discharging unit (an electronic device, such as a personal computer and a printer) which is driven by the secondary battery 1; and 3, a power line for supplying power from the secondary battery 1 to the load 2.

Regarding a unit for determining the low battery power state, reference numeral 4 denotes MPU for controlling the whole system; 5, a bus line for transmitting an instruction from the MPU 4 to each element of the apparatus; 6, a voltage determination circuit for measuring a terminal voltage of the secondary battery 1; 7, a comparing circuit for comparing arbitrary two different values; 9, a memory for temporary storing the value measured by the voltage determination circuit 6; and 10 an operation circuit for calculating difference between arbitrary two different values.

Further, as for constitutional elements used for initialization in the third embodiment, reference numeral 13 denotes a dummy resistor used for determining an original state of the secondary battery 1; 12, a power line for supplying electric power from the secondary battery 1 to the dummy resistor 13, and 11, a selector for selecting one of units (the load 2 and the dummy resistor 13) to be supplied with power from the secondary battery.

Each data in FIG. 3 will be described. Reference numeral D1 denotes a terminal voltage of the secondary battery 1, V$_{batt}$. Reference numerals D2, D10, D11 denote data (V$_{batt}$) measured by the voltage determination circuit 6, and are sent to the comparing circuit 7, the operation circuit 10, and the memory 9, respectively. Reference numeral D13 denotes a calculated result by the operation circuit 10, and is outputted to the comparing circuit 7. Further, reference numeral D5 denotes an analyzed data by the comparing circuit 7, and is sent to the MPU 4.

Instructions issued by the MPU 4 are a control instruction D3 to control the voltage determination circuit 6, a control instruction D14 to control the operation circuit 10, a control instruction D15 to control the memory 9, a control instruction D4 to control the comparing circuit 7, a control instruction D16 to control the selector 11, and a control instruction D6 to control operations of the load 2.

<Explanation of Operations>

Figure 8:
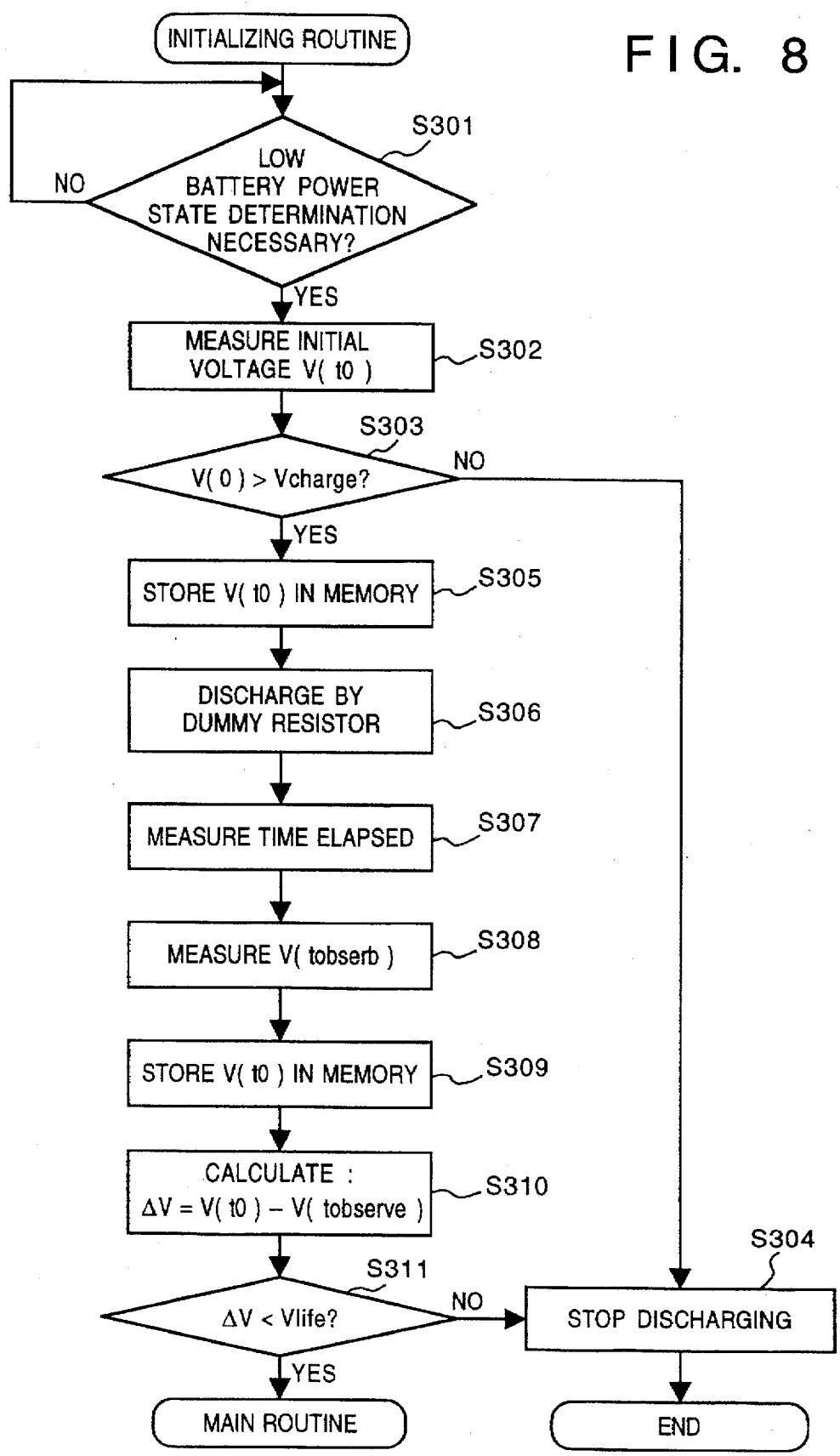
FIG. 8 is a flowchart showing a processing sequence according to the third embodiment.

An operation of the apparatus having above configuration according to the third embodiment will be described with reference to flowcharts in FIGS. 8 to 10. A program responsible for the operation of the flowchart in FIG. 7 is stored in a ROM (not shown) in the MPU 4, as in the first and second embodiments.

First, initialization will be explained with reference to a flowchart in FIG. 8.

The MPU 4 determines whether or not the low battery power state determination is necessary upon driving a device (load 2) at step S301. If the apparatus is supplied with electricity from an AC adapter or the like, following sequence is not performed ("No" at step S301).

When the low battery power state determination is necessary since power is supplied to the apparatus from the secondary battery 1, namely, "Yes" at step S301, the MPU 4 controls the voltage determination circuit 6 to measure a voltage, V(t$_0$), across the secondary battery 1 just before starting discharge at step S302. The voltage determination circuit 6 transmits the detected result D2 to the comparing circuit 7. The comparing circuit 7 compares V(t$_0$) with a value V$_{charge}$ (designated by MPU 4 as D4) at step S303. The comparison result D5 is transmitted to the MPU 4. On the basis of the comparison result, the MPU 4 controls apparatus as follow.

If $V(t_0) \leq V_{charge}$ (No, at step S303), then the secondary battery 1 is not charged enough, and is not in the state capable of driving the device (load 2). Therefore, the MPU 4 controls so that the device is not operated (step S311).

Whereas, if $V(t_0) > V_{charge}$ (Yes, at step S303), the secondary battery 1 is sufficiently charged. Accordingly, the MPU 4 controls the system to operate, and the process proceeds to next step.

First, $V(t_0)$ is temporary stored in the memory 9 at step S305, then the MPU 4 controls the selector 11 to select the dummy resistor 13 to be connected with the secondary battery 1 and the secondary battery to discharge at step S306. Then, after a predetermined time period $t_{observe}$ elapses (step S307), it controls the voltage determination circuit 6 to determine a terminal voltage of the secondary battery 1 $V(t_{observe})$ at step S308. The MPU 4 controls the memory 9 to transmit $V(t_0)$ to the operation circuit 10 at step S309.

The operation circuit 10 calculates in accordance with following equation at step S310

$$\Delta V = V(t_0) - V(t_{observe})$$

The calculated result $\Delta V$ is transmitted to the comparing circuit 7, which compares a value $V_{life}$ with $\Delta V$ at step S310.

The comparison result D5 is transmitted to the MPU 4. The MPU 4 performs following determination on the basis of the comparison result.

If $V \Delta V \geq V_{life}$ (No, at step S311), then the MPU 4 determines that life span of the secondary battery 1 is expired, and the battery 1 is not in a state capable of driving a device (load 2). Accordingly, the MPU 4 does not allow the device to operate (step S304).

Figure 9:
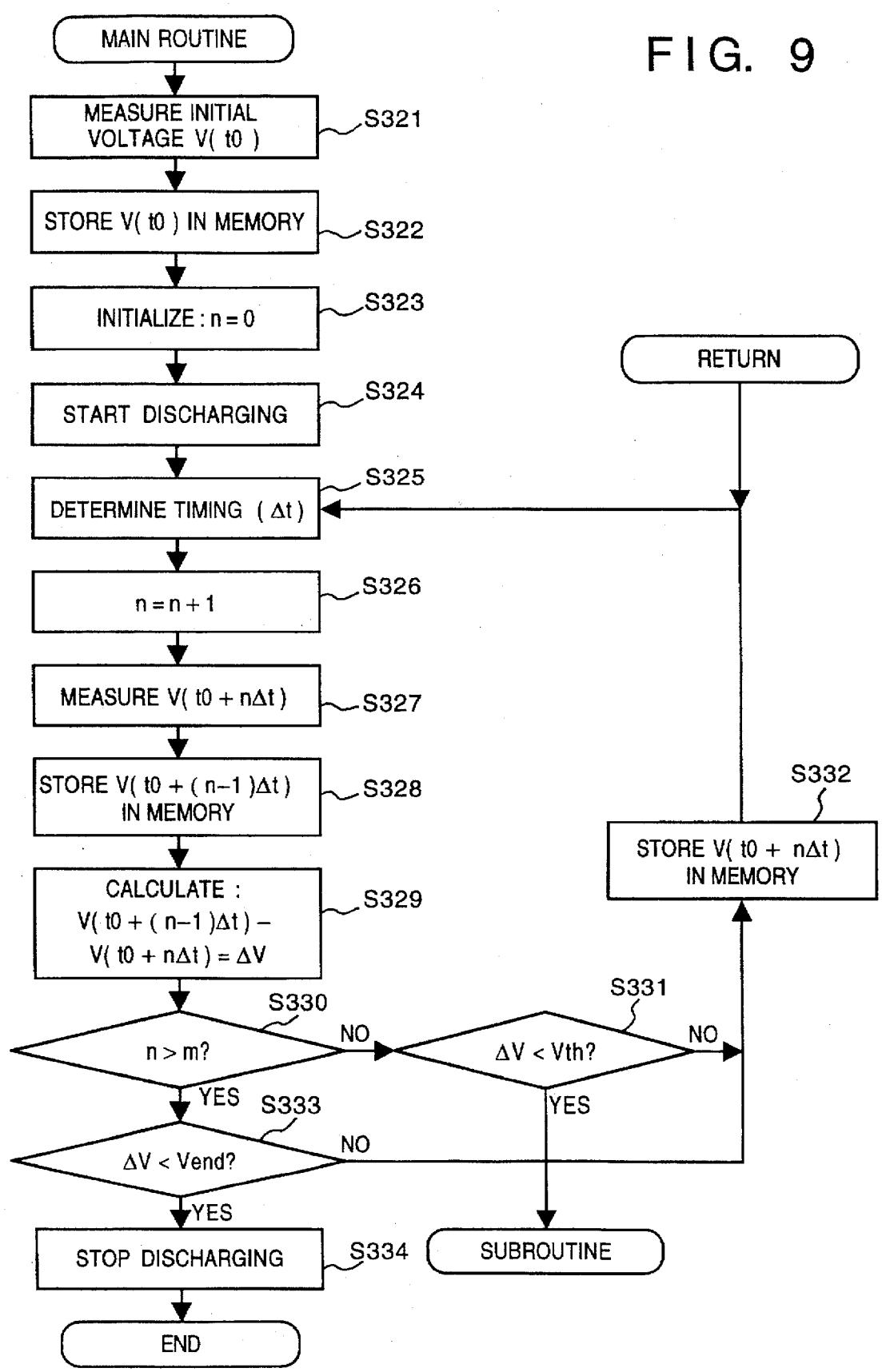
FIG. 9 is a flowchart showing a processing sequence according to the third embodiment.

If $\Delta V < V_{life}$ (Yes, at step S311), then the MPU determines that the life span of the secondary battery 1 is not expired, thus controls the system to be ready for the next state (The process proceeds to "MAIN ROUTINE" in FIG. 9).

A process "MAIN ROUTINE" (low battery power state determination), i.e., a process where it is determined that the life span of the secondary battery 1 is not expired at step S311, will be next described with reference to a flowchart in FIG. 9.

First, the MPU 4 controls the voltage determination circuit 6 to measure the voltage of the secondary battery 1 $V(t_0)$ just before starting discharge at step S321, and the determined $V(t_0)$ is stored in the memory 9 at step S322.

Next, the MPU 4 initializes the system at step S323. At this time, a variable n, kept in a RAM (not shown) provided in the MPU 4, is also reset to "0".

Then, the device (load 2) starts operating, driven by the secondary battery 1, at step S324.

After this, the MPU 4 determines a timing to determine the low battery power state, and starts performing the low battery power state determination at step S325. The low battery power state determination is performed at every fixed time interval ($\Delta t$), and each time after the determination routine, the variable n is incremented by 1 (n=n+1) at step S326.

At the timing for the low battery power state determination, the voltage determination circuit 6 measures the terminal voltage of the secondary battery 1 $V(t0+n\Delta t)$ at step S327. Then, the MPU 4 controls the memory 9 to transmit the terminal voltage of the secondary battery 1 $V(t_0-(n-1)\Delta t)$, determined in the former routine, to the operation circuit 10 at step S328.

The operation circuit 10 performs following calculation at step S329.

$$\Delta V = V(t_0-(n-1)\Delta t) - V(t_0-n\Delta t)$$

Namely, difference between the value $V(t_0-(n-1)\Delta t)$ transmitted from the memory 9 and the latest voltage $V(t0-n\Delta t)$ measured by the voltage determination circuit 6 is calculated.

Next, the MPU 4 measures a time elapsed, and determines whether or not the predetermined time has elapsed at step S330 since the above operation was started. This determination is performed by determining whether or not the variable n becomes a predetermined value, for instance. More specifically, the determination is performed by comparing the variable n with a predetermined value m (in other words, whether or not time period $m\Delta t$ has elapsed since the low battery power state determination was started is determined at step S325).

If the predetermined time period has not elapsed, namely, if $n \leq m$, a determination at next step S331 is performed.

At step S331, the calculated result $\Delta V$ at previous step S329 and a predetermined value $V_{th}$ is compared by the comparing circuit 7.

The comparison result D5 is transmitted to the MPU 4, and the MPU 4 performs following determination on the basis of the comparison result.

If $\Delta V \leq V_{th}$ (No, at step S331), it is determined that the resistance of the load 2 is normal, and the process proceeds to step S332.

Whereas, if $\Delta V > V_{th}$ (Yes, at step S331), a resistance of the load 2 is very light. In such a case, the secondary battery 1 will be discharged at a high discharge rate, thus there is a possibility that the voltage of the secondary battery may drop in two stages (refer to FIG. 5). Therefore, the MPU 4 controls the apparatus to move to the process of "SUBROUTINE" (flowchart in FIG. 10) which is explained later.

On the contrary, if it is determined that the time period, $m\Delta t$, has elapsed since the secondary battery 1 started to discharge (Yes, at step S330), then the MPU 4 controls the comparing circuit 7 to compare $\Delta V$ with a predetermined voltage $V'_{end}$ (designated by the MPU 4) at step S333.

The comparison result D5 is transmitted to the MPU 4, and the MPU 4 performs following determination on the basis of the comparison result.

If $\Delta V \leq V'_{end}$ (No, at step S333), then the MPU determines that the secondary battery 1 is not in the low battery power state. Then the MPU 4 controls the memory to store $V(t_0+n\Delta t)$ at step S332, and the process moves back to step S325, and the aforesaid processes are repeated.

If $\Delta V > V'_{end}$ (Yes, at S333), then the MPU determines that the secondary battery 1 is in the low battery power state. Accordingly, the MPU 4 issues an instruction D6 to terminate the operation of the load 2, and controls the secondary battery 1 to stop discharging at step S334.

Figure 5:
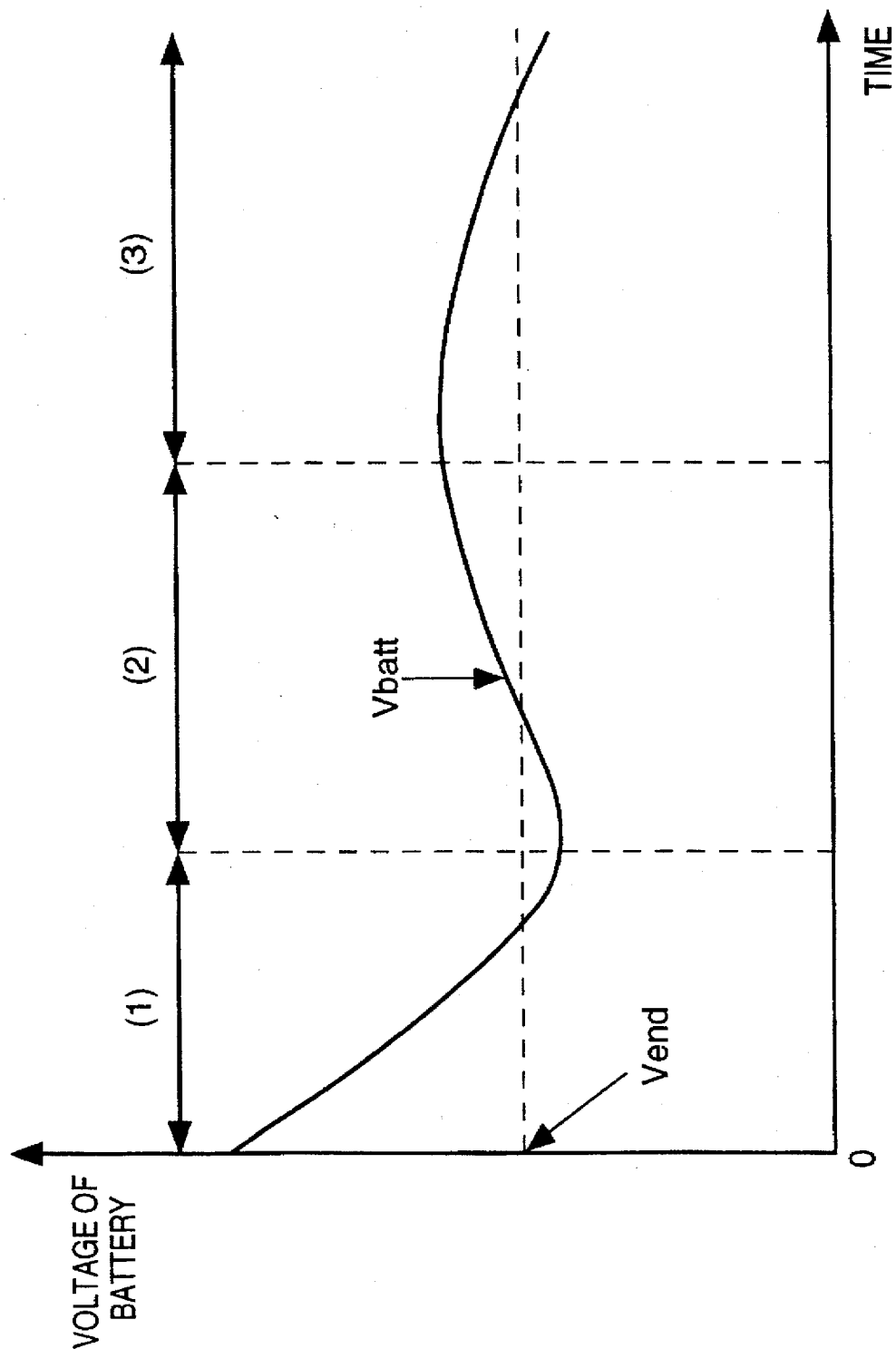
FIG. 5 is a graph showing that a voltage of the secondary battery during discharging drops in two stages.

Next, a process when the determination result of the aforesaid step S331 is "Yes", more specifically, when it is determined that $\Delta V > V_{th}$ during the predetermined time period ($m\Delta t$), (a process for avoiding misjudgment caused by two stage drops as shown in FIG. 5) will be described in accordance with FIG. 10.

First, the MPU 4 controls the memory 9 to temporary store $V(t_0+n\Delta t)$ at step S341. Then, the MPU 4 determines a timing to measure a terminal voltage of the secondary battery 1 at step S342. The terminal voltage is measured at a fixed time interval ($\Delta t$), and the number of times is counted each time after one routine at step S343.

At the timing for the terminal voltage determination of the secondary battery 1, the voltage determination circuit 6 determines the terminal voltage $V(t_0+n\Delta t)$ at step S344.

After this, the MPU 4 controls the memory 9 to transmit the terminal voltage of the secondary battery 1 $V(t_0+(n-1)\Delta t)$, determined in the former routine, to the operation circuit 10 at step S345.

The operation circuit 10 performs following calculation on the basis of the transmitted information at step S346.

$$\Delta V = V(t_0+(n-1)\Delta t) - V(t_0+n\Delta t)$$

Then MPU 4 controls the comparing circuit 7 to compare the obtained value $\Delta V$ and a value $V_{danger}$ (designated by the MPU 4) at step S347. The comparison result D5 is transmitted to the MPU 4, which determines as follow on the basis of the transmitted comparison result.

$\Delta V \leq V_{danger}$ (NO, at step S347), then the process moves to step S349.

$\Delta V > V_{danger}$ (Yes, at step S347), then the MPU 4 determines that the resistance of the load 2 is very light, and that it is risky to keep using the load 2, and controls to stop discharging from the secondary battery 1 at step S348.

When the process proceeds to S349, the MPU 4 controls the comparing circuit 7 to perform following comparison.

Whether or not $\Delta V<0$ (at step S349), namely, it is determined whether the terminal voltage of the secondary battery 1 is decreasing or increasing; and Whether or not $V(t_0+n\Delta t)>V_{ref}$ (at step S350), namely, it is determined whether the terminal voltage of the secondary battery 1 is larger than a value $V_{ref}$ (reference voltage of recovery from the two stage drop state).

The aforesaid comparison result D5 is transmitted to the MPU 4. Then the MPU 4 performs following determination on the basis of the transmitted comparison result.

If "No" at one of step S349 and step S350, then it is determined that the electromotive force of the secondary battery 1 is in the two stage drop state (states shown in (1) and (2) of FIG. 5). Therefore, the state of the system returns to step S341.

If "Yes" at both steps S349 and S350, then it is determined that the electromotive force of the secondary battery 1 is out of the two stage drop state (state shown in (3) of FIG. 5), and the process returns to the MAIN ROUTINE.

The detail of the third embodiment will be described below.

i. Initialization

In order to perform initialization, determinations are performed in consideration of following two points:

(a) Whether or not the secondary battery 1 is charged enough to supply electric power to the load 2; and (b) Whether or not the life span of the secondary battery is expired.

As for the determination (a), if the terminal voltage of the secondary battery 1 $V(t_0)$, measured just before starting discharge, is less than $V_{charge}$, then it is determined that the secondary battery has not charged enough. Further, as for the determination (b), if it is determined that voltage drop which is larger than $V_{life}$ during a fixed time interval $t_{observe}$ is determined when a current (about 0.2 A) is supplied from the secondary battery 1 to the dummy resistor, it is determined that the life span of the secondary battery is over.

Figure 10:
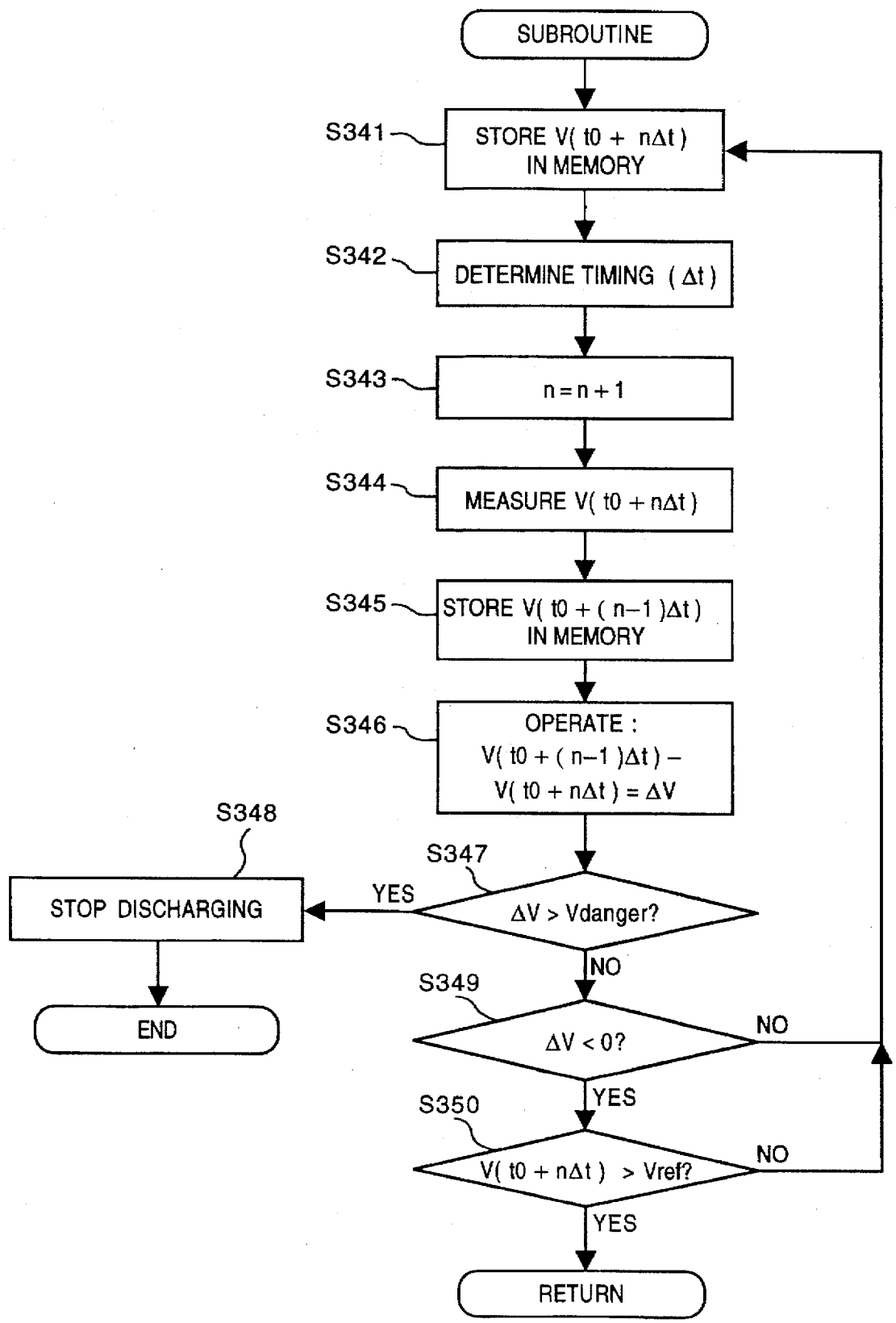
FIG. 10 is a flowchart showing a processing sequence according to the third embodiment.

The above two initializations are necessary to perform a sequence of the flowchart in FIG. 10 perfectly (since, if the secondary battery 1 has not been charged enough or the life span of the secondary battery 1 is over, a sharp voltage drop is observed without being connected to a heavy load).

ii. Determination of the Low Battery Power State

The basic sequence of the determination of the low battery power state is the same as the one in the second embodiment. However, in the third embodiment, after the secondary battery 1 starts discharging, only a resistance of a load is observed and the low battery determination is not performed until a predetermined time interval $m\Delta t$ has elapsed. At this time, when the resistance is too small, it is assumed that the phenomenon shown in FIG. 5 occurs, and an operation of the flowchart in FIG. 10 is performed.

iii. Avoidance of Two-Stage Drops

This is a sequence for avoiding misjudgment of the low battery power state caused by the two stage drops of terminal voltage of the secondary battery during high rate discharge.

As a specific method, the following process is performed.

Detection of a timing when change of the terminal voltage per predetermined time interval changes from decrease to increase.

Return to a former sequence of the low battery power state determination when the terminal voltage of the secondary battery has increased to a predetermined level $V_{ref}$.

By performing above operations, it is possible to avoid misjudgment of the low battery power state, thus it is possible to continue discharging until the secondary battery becomes the original low battery level. Namely, the electrical power of the secondary battery can be sufficiently used.

According to the third embodiment as described above, it is possible to determine whether or not the secondary battery is in the low battery power state is precisely determined at each stage in accordance with the change of voltage of the secondary battery during operations of a discharging device, or a device to be driven by the secondary battery, since the device is powered on.

Therefore, the best timing for starting charging can be determined, thereby it is possible to prevent efficiency of the secondary battery per cycle (work/cycle) from being deteriorated and the memory phenomenon from affecting a Ni-Cd, a Ni-MH secondary battery and the like.

It should be noted that in the first to third embodiments, an operation for charging the battery is not described, since the present invention relates to how to determine the "real" low battery power state, in other words, to determine the best timing to start charging the secondary battery, and is not characterized by how to charge the battery.

The MPU 4 in the each embodiment can be independent of or identical to the MPU in the load 2. In the latter case, the processing sequence can be supplied externally as a program (e.g., by a floppy disk and a program card), thus it is not always necessary to be stored in the ROM.

However, if the actual operation of the load 2 is to be controlled, it is better to separate the MPU 4 and the MPU in the load 2.

Further, the secondary battery in the embodiments can be a general secondary battery, however, the present invention is more effective when a Ni-Cd secondary battery or a Ni-MH secondary battery is used.

Furthermore, in the above embodiments, the load 2 is expressed assuming that it is a personal computer or a printer, however, the present invention is not limited to this as far as it is an electrical device which can be driven by the secondary battery. However, a device which has an operational unit, such as MPU, and requires a uniform power supply is preferred.

Figure 11:
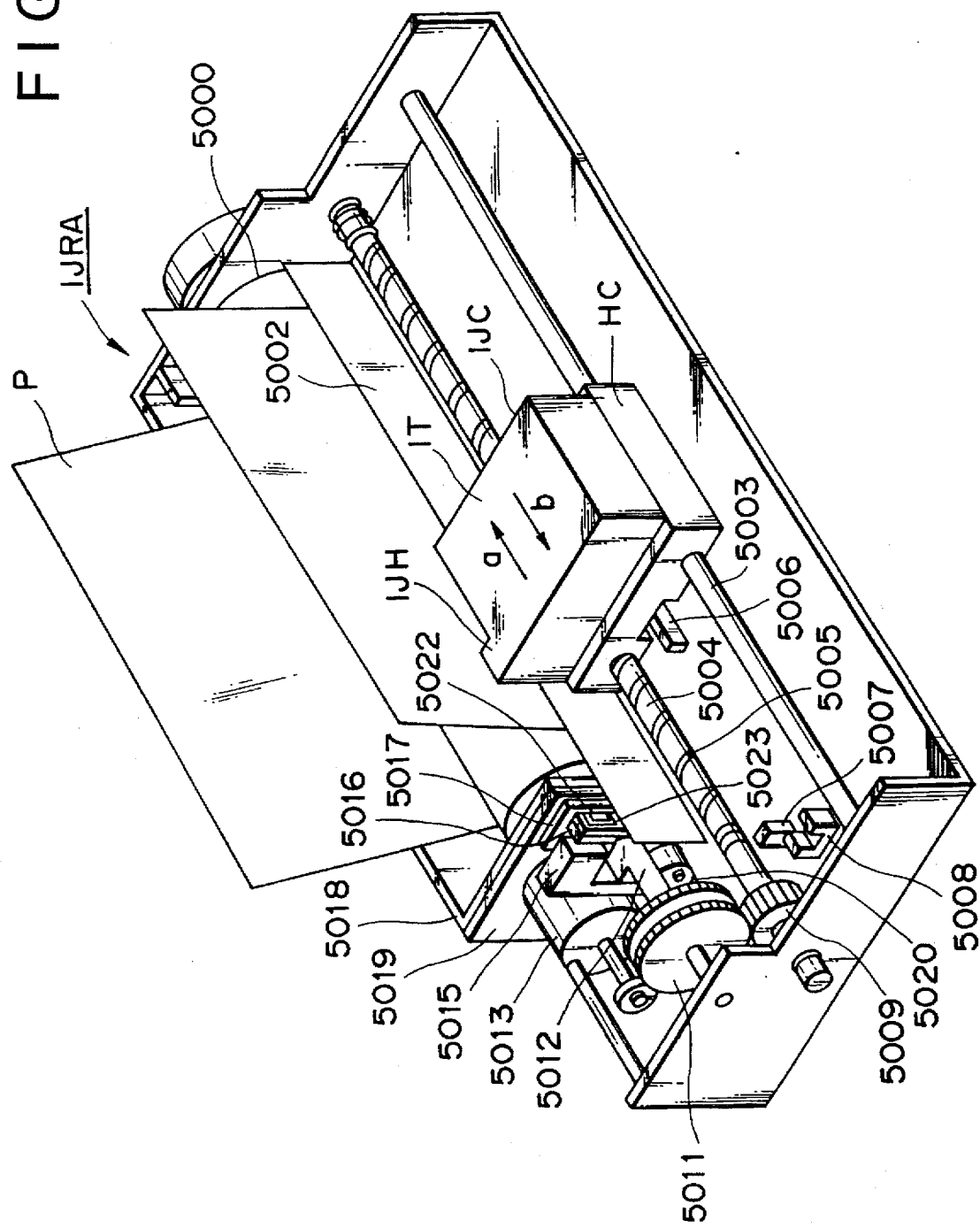
FIG. 11 is a schematic view illustrating a construction of an ink-jet printer applied in the embodiment.

For example, a hand held printer, shown in FIG. 11, is a device to which the system in the embodiments can be applied.

FIG. 11 shows the structure of ink-jet printer IJRA. In FIG. 11, a carriage HC is engaged with a spiral groove 5004 of a lead screw 5005 which rotates via driving force transmission gears 5009 to 5011 interlocking with forward/reverse rotation of a driving motor 5013. The carriage has a pin (not shown) and it is moved in the back and forth directions represented by arrows a and b. The carriage HC has an integrated ink-jet cartridge IJC including a print head IJH and an ink tank IT. A pressing plate 5002 presses a recording sheet against a platen 5000 along the moving direction of the carriage. Photocouplers 5007 and 5008 are home position detecting members for confirming the existence of lever 5006 of the carriage in this area and changing over the rotational direction of motor 5013. A support member 5016 supports a cap member 5022 for capping the front surface of the printing head. A suction member 5015 performs suction recovery of the printing head the inside of the cap member 5022 via a cap inner opening 5023. Member 5019 allows a cleaning blade 5017 to move in a back-and-forth direction. A main body support plate 5018 supports the member 5019 and the cleaning blade 5017. It is apparent that any well-known cleaning blade is applicable to the printer of the embodiments. Numeral 5021 denotes a lever for starting the suction recovery, and moves along the movement of a cam 5020 engaged with the carriage. A well-known transmission mechanism such as change-over of a clutch controls a driving force from the driving motor.

When the carriage arrives at the home position, a desired processing among capping, cleaning and suction-restoration is executed at its corresponding position by the lead screw 5005. The timing of any of these processings is not limited to the printer of the embodiments, if a desired processing is performed at a well-known timing.

The printer having aforesaid configuration does not consume much electrical power, thus it is especially preferred as a discharging unit driven by the secondary battery.

According to the present invention as described above, it becomes possible to determine the low battery power state of the secondary battery, thus the efficiency of the secondary battery can be improved, and the memory phenomenon can be prevented.

The present invention can be applied to a system constituted by a plurality of devices, or to an apparatus comprising a single device. Furthermore, the invention is applicable also to a case where the object of the invention is attained by supplying a program to a system or apparatus.

The present invention is not limited to the above embodiments and various changes and modifications can be made within the spirit and scope of the present invention. Therefore to appraise the public of the scope of the present invention, the following claims are made.

What is claimed is:

1. A low battery power state detection apparatus for a secondary battery supplying power to an electrical apparatus whose load changes at a predetermined period, comprising:

voltage detection means for detecting a discharged voltage from the secondary battery when the load of said electrical apparatus is a predetermined load during discharge of the secondary battery;

current detection means for detecting a discharged current from the secondary battery when the load of said electrical apparatus is the predetermined load during discharge of the secondary battery;

determination means for determining a threshold voltage value on the basis of the current detected by said current detection means, said threshold voltage value being used for judging whether or not the secondary battery is in the low battery power state; and judging means for judging whether or not the secondary battery is in the low battery power state by comparing the threshold voltage value determined by said determination means with the voltage detected by said voltage detection means.

2. A low battery power state detection method for a secondary battery supplying power to an electrical apparatus whose load changes at a predetermined period, comprising the steps of:

detecting a discharged current of the secondary battery when the load of said electrical apparatus is a predetermined load during discharge of the secondary battery;

determining a threshold voltage value on the basis of the discharged current detected by said current detection step, said threshold voltage value being used for judging whether or not the secondary battery is in the low battery state;

detecting a discharged voltage of the secondary battery when the load of said electrical apparatus is the predetermined load during discharge of the secondary battery; and judging whether or not the secondary battery is in the low battery power state by comparing the threshold voltage value determined in said determining step with the discharged voltage detected in said voltage detecting step.

3. A low battery power state determination apparatus for a secondary battery supplying an electric apparatus with power, comprising:

voltage detection means for detecting a discharged voltage from the secondary battery at a first predetermined period during discharge of the secondary battery;

determination means for determining change of discharged voltage on the basis of the discharged voltage detected by said voltage detection means;

judging means for judging whether or not the secondary battery is in the low battery state on the basis of change of the discharged voltage from the secondary battery determined by said determination means and a predetermined value; and inhibiting means for inhibiting said judging means from judging until a second predetermined period has elapsed after the secondary battery starts discharging, said second predetermined period being longer than the first predetermined period.

4. The low battery power state determination apparatus for a secondary battery according to claim 3, wherein said determination means comprises memory means for storing the discharged voltage detected in the previous routine of the low battery state determination process by said voltage detection means and subtraction means for calculating a difference between the discharged voltage stored in said memory means and the currently detected discharged voltage.

5. The low battery power state determination apparatus for a secondary battery according to claim 3, further comprising:

first control means for controlling said voltage detection means and said determination means to repeatedly operate after the secondary battery is judged by said judging means that it is not in the low battery power state;

second judging means for judging that the secondary battery is in the low battery power state when the change of voltage obtained by said determination means is larger than a predetermined value after a predetermined time period has elapsed under control of said first control means;

second control means for controlling said voltage detection means and said determination means to repeatedly operate when the change of voltage obtained by said determination means is larger than a predetermined value before the predetermined time period has elapsed under control of said first control means; and stopping means for stopping discharging from the secondary battery, when the change of voltage obtained by said determination means is larger than the predetermined value, by determining that a load is too heavy for the secondary battery under control of said second control means.

6. A low battery power state determination method for a secondary battery supplying an electric apparatus with power, comprising:

a voltage detection step of detecting a discharged voltage of the secondary battery at a first predetermined period;

a determination step of determining change of discharged voltage on the basis of the discharged voltage detected in said voltage detection step;

a judging step of judging whether or not the secondary battery is in the low battery state on the basis of the change of the discharged voltage from the secondary battery determined in said determination step and a predetermined value; and an inhibition step of inhibiting said judging step from judging until a second predetermined period has elapsed after the secondary battery starts discharging, said second predetermined period being longer than said first predetermined period.

7. The low battery power state determination method for a secondary battery according to claim 6, wherein said determination step comprises a memory step of storing the discharged voltage detected in the previous routine of the low battery state determination process in said voltage detection step and a subtraction step of calculating a difference between the discharged voltage stored in said memory step and the currently detected discharged voltage.

8. The low battery power state determination method for a secondary battery according to claim 6, further comprising:

a first control step of repeatedly operating said voltage detection step and said determination step after the secondary battery is judged in said judging step that it is not in the low battery power state;

a second judging step of judging that the secondary battery is in the low battery power state when the change of voltage obtained in said determination step is larger than a predetermined value after a predetermined time period has elapsed during said first control step;

a second control step of repeatedly operating said voltage detection step and said determination step when the change of voltage obtained in said determination step is larger than a predetermined value before the predetermined time period has elapsed during said first control step; and a stopping step of stopping discharging from the secondary battery, when the change of voltage obtained in said determination step is larger than the predetermined value, by determining that a load is too heavy for the secondary battery during said second control step.

* * * * *